United States Patent
Pathangi Sriraman

(10) Patent No.: US 10,529,534 B2
(45) Date of Patent: Jan. 7, 2020

(54) COMPENSATING FOR SCANNING ELECTRON MICROSCOPE BEAM DISTORTION-INDUCED METROLOGY ERROR USING DESIGN

(71) Applicant: KLA-TENCOR CORPORATION, Milpitas, CA (US)

(72) Inventor: Hari Pathangi Sriraman, Chennai (IN)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 15/965,061

(22) Filed: Apr. 27, 2018

(65) Prior Publication Data

US 2019/0214223 A1 Jul. 11, 2019

Related U.S. Application Data

(60) Provisional application No. 62/635,316, filed on Feb. 26, 2018.

(30) Foreign Application Priority Data

Jan. 5, 2018 (IN) .............................. 201841000566

(51) Int. Cl.
*H01J 37/22* (2006.01)
*G01B 15/00* (2006.01)
(Continued)

(52) U.S. Cl.
CPC ............ *H01J 37/222* (2013.01); *G01B 15/00* (2013.01); *G06N 20/00* (2019.01); *G06T 7/0004* (2013.01);
(Continued)

(58) Field of Classification Search
CPC ........... H01J 37/222; H01J 37/28; G06T 7/97; G06T 7/0004; G06T 2207/10061;
(Continued)

(56) References Cited

U.S. PATENT DOCUMENTS

2008/0183323 A1 7/2008 Menadeva et al.
2011/0006207 A1* 1/2011 Arjavac ................... G01N 1/32
250/307

(Continued)

FOREIGN PATENT DOCUMENTS

JP 2010266900 A 11/2010

OTHER PUBLICATIONS

ISA/KR, International Search Report and Written Opinion for PCT/US2019/01225 dated Apr. 30, 2019.

*Primary Examiner* — Nicole M Ippolito
*Assistant Examiner* — Hanway Chang
(74) *Attorney, Agent, or Firm* — Hodgson Russ LLP

(57) ABSTRACT

Methods and systems for quantifying and correcting for non-uniformities in images used for metrology operations are disclosed. A metrology area image of a wafer and a design clip may be used. The metrology area image may be a scanning electron microscope image. The design clip may be the design clip of the wafer or a synthesized design clip. Tool distortions, including electron beam distortions, can be quantified and corrected. The design clip can be applied to the metrology area image to obtain a synthesized image such that one or more process change variations are suppressed and one or more tool distortions are enhanced.

20 Claims, 6 Drawing Sheets

(51) Int. Cl.
  *H01J 37/28* (2006.01)
  *G06T 7/00* (2017.01)
  *G06N 20/00* (2019.01)

(52) U.S. Cl.
  CPC ............... *G06T 7/97* (2017.01); *H01J 37/28* (2013.01); *G06T 2207/10061* (2013.01); *G06T 2207/20081* (2013.01); *G06T 2207/20216* (2013.01)

(58) Field of Classification Search
  CPC ........... G06T 2207/20081; G06T 2207/20216; G06N 20/00; G01B 15/00
  USPC ................ 250/306, 307, 492.1, 492.2, 492.3
  See application file for complete search history.

(56) References Cited

U.S. PATENT DOCUMENTS

| | | |
|---|---|---|
| 2012/0098953 A1 | 4/2012 | Kotaki et al. |
| 2016/0035076 A1 | 2/2016 | Schwarzband et al. |
| 2017/0337673 A1 | 11/2017 | Tseng et al. |

\* cited by examiner

COMPENSATING FOR SCANNING ELECTRON MICROSCOPE BEAM DISTORTION-INDUCED METROLOGY ERROR USING DESIGN

CROSS-REFERENCE TO RELATED APPLICATIONS

This application claims priority to the Indian patent application filed Jan. 5, 2018 and assigned App. No. 201841000566, and to the provisional patent application filed Feb. 26, 2018 and assigned U.S. App. No. 62/635,316, the disclosures of which are hereby incorporated by reference.

FIELD OF THE DISCLOSURE

This disclosure relates to semiconductor wafer metrology.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Metrology processes are used at various steps during semiconductor manufacturing to monitor and control the process. Metrology processes are different than inspection processes in that, unlike inspection processes in which defects are detected on wafers, metrology processes are used to measure one or more characteristics of the wafers that cannot be determined using existing inspection tools. Metrology processes can be used to measure one or more characteristics of wafers such that the performance of a process can be determined from the one or more characteristics. For example, metrology processes can measure a dimension (e.g., line width, thickness, etc.) of features formed on the wafers during the process. In addition, if the one or more characteristics of the wafers are unacceptable (e.g., out of a predetermined range for the characteristic(s)), the measurements of the one or more characteristics of the wafers may be used to alter one or more parameters of the process such that additional wafers manufactured by the process have acceptable characteristic(s).

With increasing pattern density and complexity in advanced technology nodes, automated in-line metrology operations that use a scanning electron microscope (SEM) are claiming an increased share in advanced process control. However, images obtained using SEMs are prone to certain non-uniformities across the field of view (FOV). Most of these non-uniformities are tolerable or negligible for a defect review, classification, or similar exercise. However, such non-uniformities within or across the FOV can lead to systematic or random measurement error in a metrology operation.

Some non-uniformities can include SEM beam-induced distortions that result from beam position error, beam spot size error, stigmation error, or other causes. Some layers that are imaged also can exhibit this behavior due to primary beam deflections at the edges of the FOV. Such errors often can induce image distortions within a single FOV or across multiple FOVs at different parts of the wafer.

FIGS. 5-8 are exemplary SEM images demonstrating non-uniformities or process systematics by comparison. FIG. 5 is a clean image with no visible distortions across the FOV. FIG. 6 is a distorted image with distortions across the FOV. In the contact hole array region of FIG. 6, the contacts at the edge of the FOV are distorted due to an uncalibrated beam used for imaging. Diameter measurement of the distorted contact holes will be affected due to the distortion effects.

FIG. 7 is a clean image without process systematics. The average diameter of the contacts in the FOV is similar FIG. 8 is an image with process systematics. The average diameter of the contacts in the FOV is different. The image of FIG. 8 may be labeled as an undistorted clean image in terms of beam distortions.

To add to the complexity of this problem, many SEM images are averaged across multiple frames. These distortions may not have a constant contribution to the individual frames. The SEM image can exhibit charging artefacts or shows untrue representations of the structures that are imaged.

While these distortions may not be critical for review or classification, the performance of metrology operations can be improved by quantifying and correcting for them. Therefore, improved methods and systems for semiconductor wafer metrology are needed.

BRIEF SUMMARY OF THE DISCLOSURE

In a first embodiment, a method of compensating for scanning electron microscope beam distortion-induced metrology error is provided. A metrology area image of a wafer and a design clip from a storage medium are received at a processor. The design clip is applied to the metrology area image using the processor thereby obtaining a synthesized image. One or more process change variations are suppressed and one or more tool distortions are enhanced. Metrology operations can be performed on the synthesized image.

The design clip can be a design for the wafer or a synthesized design clip. The synthesized design clip can be generated using the process change variations with a machine algorithm and communicating the synthesized design clip to the storage medium. Generating the synthesized design clip can further include receiving images and data from one or more process modulated wafers at a machine learning module and learning the process change variations at the machine learning module using the machine algorithm. The machine algorithm may be a deep learning algorithm.

The metrology area image can be a scanning electron microscope image or an average of a plurality of scanning electron microscope images.

The storage medium can be a persistent, non-transient storage medium.

The metrology area image of the wafer can be obtained using a scanning electron microscope.

System components of a wafer metrology tool can be tuned to reduce distortion based on the metrology operations.

In a second embodiment, a system for compensating for distortion-induced metrology error is provided. The system includes a wafer metrology tool configured to produce a metrology area image and a processor in electronic communication with the wafer metrology tool. The processor is configured to receive and apply a design clip to the metrology area image such that one or more process change variations are suppressed and one or more tool distortions are enhanced thereby obtaining a synthesized image. The wafer metrology tool may be a scanning electron microscope.

The system can include an electronic data storage medium containing the design clip. The electronic data storage medium may be in electronic communication with the processor.

The processor may be configured to perform metrology operations on the synthesized image.

The design clip may be a synthesized design clip. In this instance, the system includes a machine learning module that is configured to receive images and data from one or more process modulated wafers; learn the process change variations using the images and data; and generate the synthesized design clip using the process change variations.

In a third embodiment, a non-transitory computer-readable storage medium comprising one or more programs for executing steps on one or more computing devices is provided. The steps can include applying a design clip to a metrology area image thereby obtaining a synthesized image such that one or more process change variations are suppressed and one or more tool distortions are enhanced and sending instructions to perform metrology operations on the synthesized image.

The design clip may be a synthesized design clip. In this instance, the steps include generating the synthesized design clip using the process change variations with a machine algorithm. The machine algorithm may be a deep learning algorithm.

The metrology area image may be a scanning electron microscope image or an average of a plurality of scanning electron microscope images.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments of the present disclosure provide a method and system for quantifying and correcting for non-uniformities in images used for metrology operations. Tool distortions can be quantified. The frame-level behavior of the distortions can be accounted for, and where appropriate, the distortions can be corrected. In an instance, the SEM image and design clip are used to quantify and correct for FOV distortions.

Embodiments disclosed herein can improve metrology operations by using inline algorithms to correct for the tool distortions, which can include electron beam distortions. Improvements to metrology operations may be based on quantified distortion.

However, not all distortions are tool distortions. In particular, random process variability can induce changes in pattern fidelity, which yields process change variations. Thus, the embodiments disclosed herein also can isolate tool distortions from process change variations.

Figure 1:
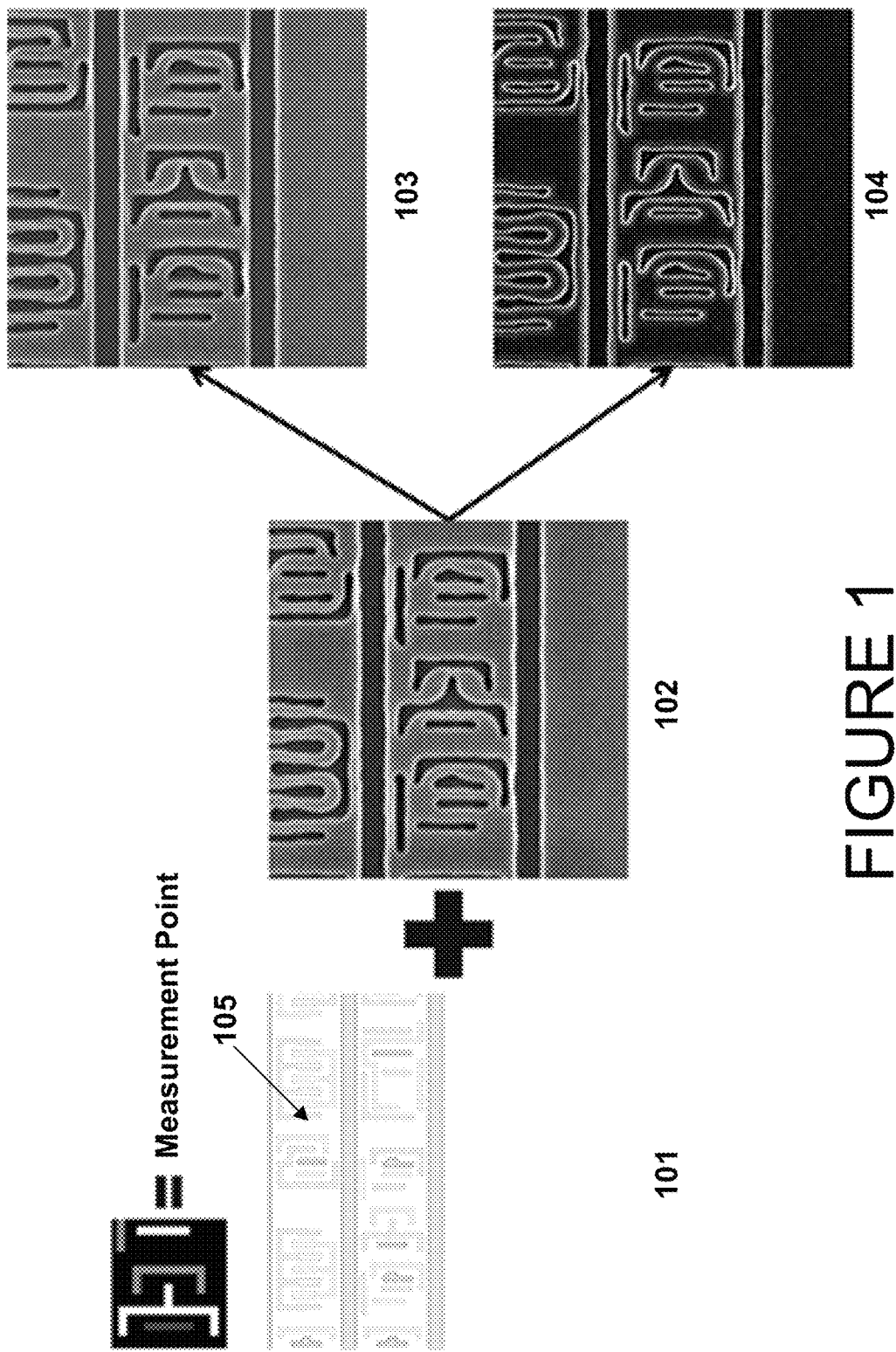
FIG. 1 illustrates an exemplary design clip, an exemplary SEM image, an exemplary overlay of the design clip on the SEM averaged image, and an exemplary synthesized design clip.

With reference to FIG. 1, a design clip 101 contains design polygons 105. The design clip 101 may be a design of the wafer having metrology measurements taken. FIG. 1 also illustrates an SEM image 102 compiled by averaging over multiple individual frames, an overlay 103 of design polygons over the SEM image 102, and a synthesized image 104. These are only examples. Other device designs, images, overlays, or synthesized images are possible.

Figure 2:
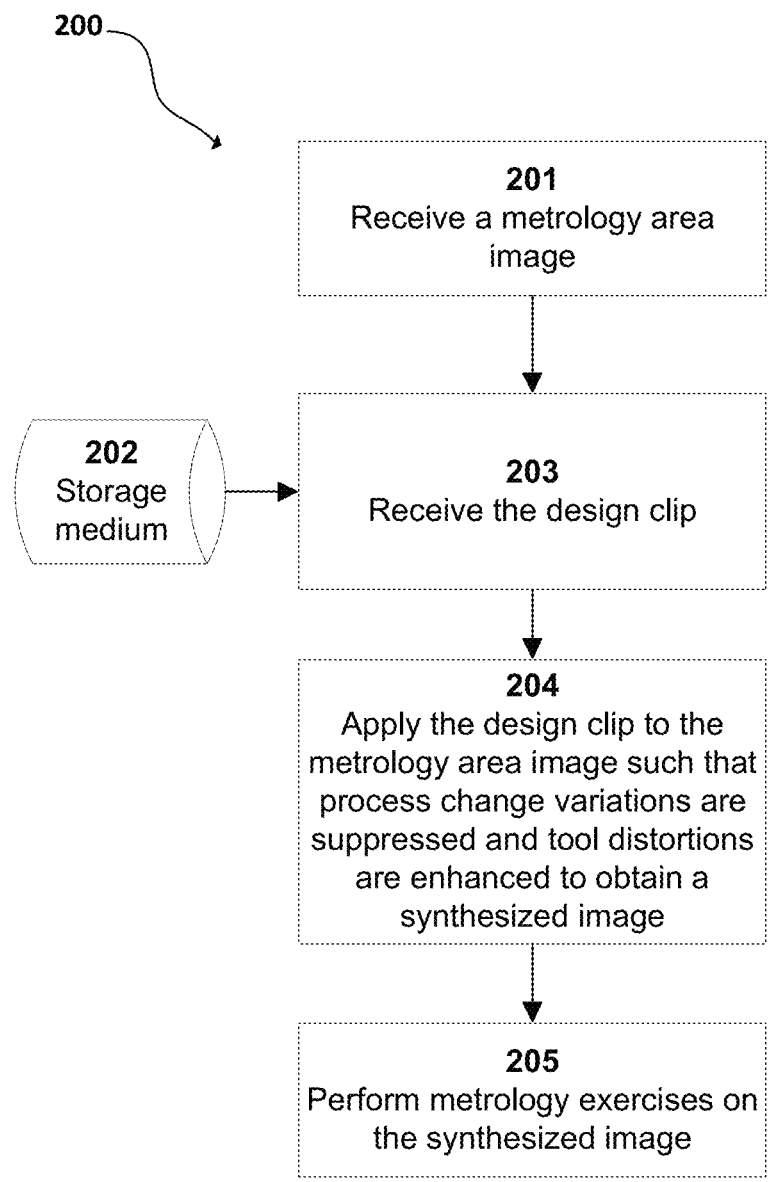
FIG. 2 shows an embodiment of a method of using a stored synthesized design clip to improve a metrology process in accordance with the present disclosure.

FIG. 2 shows an embodiment of a method 200 of using a design clip to improve a metrology process. The method 200 can compensate for SEM beam distortion-induced metrology error.

A metrology area image of a wafer, such as the SEM image 102 of FIG. 1, is received in step 201. The metrology area image may be an SEM image or an average of a plurality of SEM images. In step 203, a design clip is received from an electronic data storage medium 202, which may be a persistent, non-transient storage medium. The design clip may be a design for the wafer. The design clip also may be a synthesized design clip, as described with respect to FIG. 3.

While SEM images are disclosed, transmission electron microscopy (TEM) images also may be used.

Figure 6:
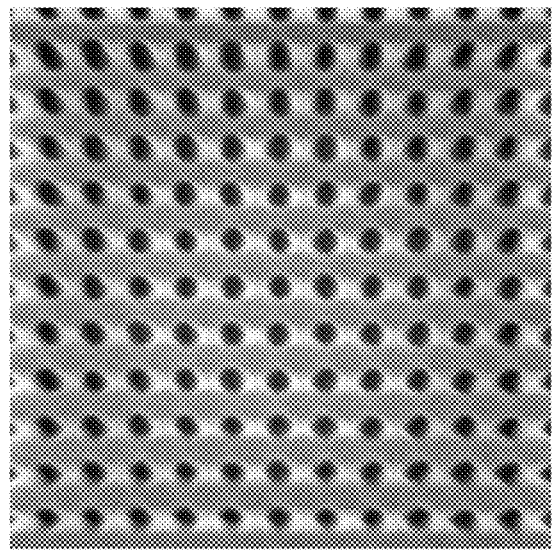
Figure 7:
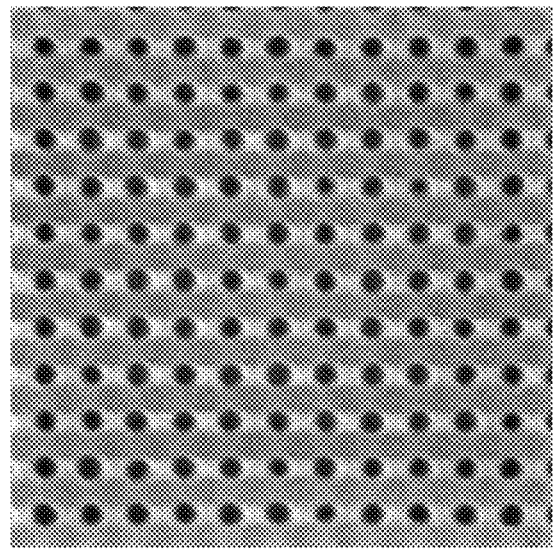
FIGS. 7 and 8 are exemplary SEM images demonstrating tool distortions and process change variations by comparison.
Figure 8:
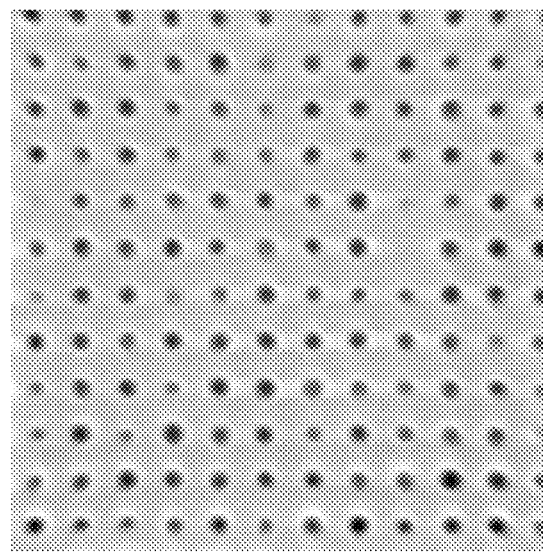

The design clip is applied to the metrology area image in step 204 such that process change variations are suppressed and tool distortions are enhanced. For example, FIGS. 7 and 8 are exemplary SEM images demonstrating enhancement of tool distortions and suppression of process change variations. The embodiments disclosed herein can, for example, suppress the distortions seen in FIG. 6 while keeping changes seen in FIG. 8. These changes may need to be identified or captured.

The design clip can be applied to the metrology area image using an image comparison and rendering process. This can ensure that the design clip matches as closely as possible to the SEM image. Machine learning can assist with the image comparison and rendering.

Turning back to FIG. 2, a synthesized image is obtained using step 204. Metrology operations can be performed on the synthesized image in step 205. For example, metrology can be used to quantify and subtract the effect of the distortions. Additional measurements may be performed using the SEM image.

The design clip can be used as a reference for quantifying distortions in the metrology area image. If all differences in the metrology area image and the design clip are caused by, for example, the SEM beam, SEM system hardware, or SEM system software, then the distortions can be isolated and/or quantified. After the distortions are isolated and/or quantified, then an algorithm can be used to correct the distortions during metrology operations. Thus, tuning may be performed.

The embodiments of FIG. 2 can improve the accuracy and precision of metrology results generated by an inspection tool, which can contribute to tighter process control data.

The metrology area image may be obtained using an SEM, which also may perform the metrology operations. In another instance, different metrology systems may obtain the metrology area image and perform further metrology operations.

Differences between the metrology area image and the design clip may not all be from the SEM beam, SEM system hardware, or SEM system software. Random process variability can induces changes in pattern fidelity. In such instances, the difference between the metrology area image and the design clip coming from the tool distortions and process changes may need to be isolated. Images and data from process modulated wafers can be used to generate a synthesized design clip to address this issue.

Figure 3:
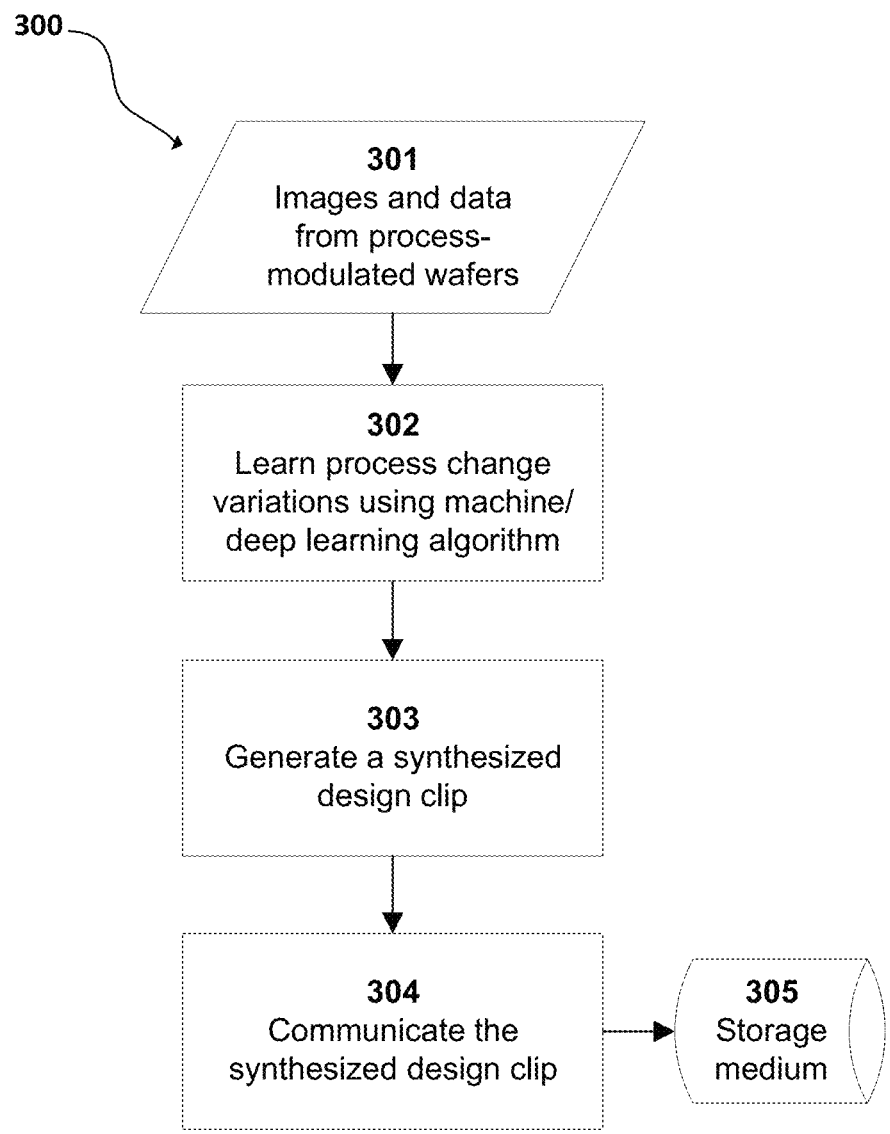
FIG. 3 shows an embodiment of a method of generating and storing a synthesized design clip in accordance with the present disclosure.

FIG. 3 shows an embodiment of a method 300 of generating and storing a synthesized design clip. Images or images and data from one or more process modulated wafers 301 are received at a machine learning module. The data can include, for example, metadata related to the alignment process and/or rendering. The images or images and data can be inputted into a machine or deep learning algorithm at the machine learning module at step 302 to learn process change variations. These process change variations are used in step 303 to generate a synthesized design clip, which in step 304 is communicated with and/or stored in an electronic data storage medium 305. The design clip can be generated with an overlay and rendering process. The synthesized design clip in the electronic data storage medium 305 can then be used in one or more metrology or inspection steps. The synthesized design clip can suppress process variations across FOVs over multiple training cycles and enhance beam tool induced distortions. Machine learning can become better and more robust with an increasing number of training cycles because additional images or data can be used to learn from.

The machine algorithm may be a deep learning algorithm. The deep learning algorithm may be a deep learning neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and can excel in areas where the solution or feature detection is difficult to express in a traditional computer program. Deep learning is a probabilistic graph model with multiple neuron layers, commonly known as a deep architecture. Deep learning technology processes the information such as image, text, voice, or other inputs in a hierarchical manner. In using deep learning in the present disclosure, feature extraction may be accomplished automatically using learning from data. This is advantageous over previous approaches which extract features based on experts' understanding of a set of images Neural networks typically consist of multiple layers, and the signal path traverses from front to back. The goal of the neural network is to solve problems in the same way that the human brain would. Neural network projects typically work with a few thousand to a few million neural units and millions of connections. The neural network may have any suitable architecture and/or configuration known in the art.

There are many variants of neural networks with deep architecture depending on the probability specification and network architecture, including, but not limited to, a Deep Belief Network (DBN), a Restricted Boltzmann Machine (RBM), an Auto-Encoders, or a convolutional neural network (CNN). The actual implementation may vary depending on the information available, size of the information provided, and the nature of the problem.

Of course, other types of machine learning algorithms may be used. These are merely listed as examples.

In an instance, the machine algorithm can learn polygon shapes and map pixel-to-pixel between the SEM image and the design clip.

An overlay of the synthesized image 104 to the SEM image 102 in FIG. 1 can mean that differences are primarily tool-based and not based on the design.

The machine or deep learning algorithm 302 can be repeated in a continuous process to constantly refine the algorithm to better neglect random variations or process change variations, and, thus, better isolate and correct for tool induced distortions. Over repetitive learning cycles, the model can become more process-aware.

The machine or deep learning algorithm can be integrated with the design-based tool-induced distortion reduction for on-tool SEM metrology operations. This can improve the accuracy and precision of the metrology results generated by the SEM system and, consequently, contribute to tighter process control data.

In another embodiment of the present invention and with reference to FIG. 2 and FIG. 3, electronic data storage medium 202 and electronic data storage medium 305 refer to the same electronic data storage medium or different electronic data storage mediums.

In an embodiment, the results of the methods illustrated in FIG. 2 or FIGS. 2 and 3 can be used as a feedback loop for tool tuning. For example, system components in an SEM system that are causing a distortion can be identified. These system components can be tuned or otherwise adjusted based on the results. Distortion can be reduced or eliminated during calibration.

Figure 4:
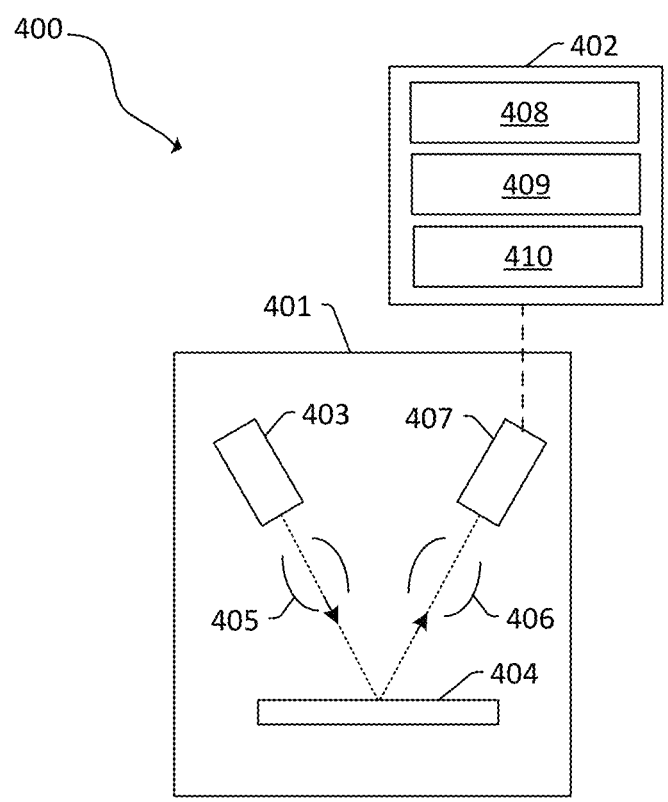
FIG. 4 is a block diagram of an embodiment of a system in accordance with the present disclosure.
Figure 5:
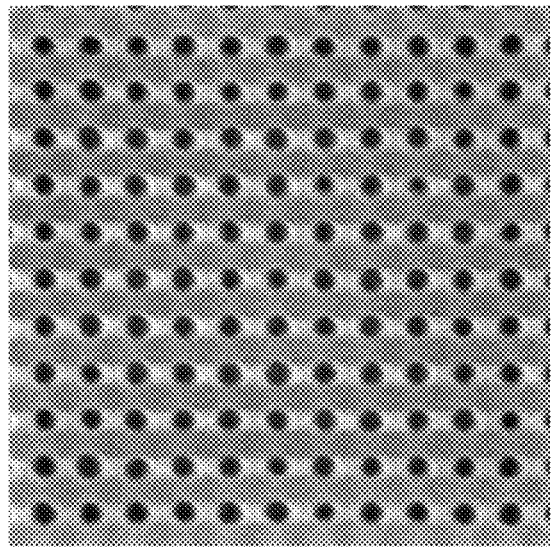
FIGS. 5 and 6 are exemplary SEM images demonstrating non-uniformities by comparison.

FIG. 4 is a block diagram of an embodiment of a system 400 for compensating for SEM beam distortion-induced metrology error. The system 400 includes a wafer metrology tool configured to produce a metrology area image. The wafer metrology tool may be an SEM or another type of metrology tool.

The wafer metrology tool includes an output acquisition subsystem that includes at least an energy source and a detector. The output acquisition subsystem may be an electron beam-based output acquisition subsystem. For example, in one embodiment, the energy directed to the wafer 404 includes electrons, and the energy detected from the wafer 404 includes electrons. In this manner, the energy source may be an electron beam source. In one such embodiment shown in FIG. 4, the output acquisition subsystem includes electron column 401, which is coupled to computer subsystem 402.

As also shown in FIG. 4, the electron column 401 includes an electron beam source 403 configured to generate electrons that are focused to wafer 404 by one or more elements 405. The electron beam source 403 may include, for example, a cathode source or emitter tip. The one or more elements 405 may include, for example, a gun lens, an anode, a beam limiting aperture, a gate valve, a beam current selection aperture, an objective lens, and a scanning subsystem, all of which may include any such suitable elements known in the art.

Electrons returned from the wafer 404 (e.g., secondary electrons) may be focused by one or more elements 406 to detector 407. One or more elements 406 may include, for example, a scanning subsystem, which may be the same scanning subsystem included in element(s) 405.

The electron column also may include any other suitable elements known in the art.

Although the electron column 401 is shown in FIG. 4 as being configured such that the electrons are directed to the wafer 404 at an oblique angle of incidence and are scattered from the wafer 404 at another oblique angle, it is to be understood that the electron beam may be directed to and scattered from the wafer 404 at any suitable angles. In addition, the electron beam-based output acquisition subsystem may be configured to use multiple modes to generate images of the wafer 404 (e.g., with different illumination angles, collection angles, etc.). The multiple modes of the electron beam-based output acquisition subsystem may be different in any image generation parameters of the output acquisition subsystem.

Computer subsystem 402 may be coupled to detector 407 as described above. The detector 407 may detect electrons returned from the surface of the wafer 404 thereby forming electron beam images of the wafer 404. The electron beam images may include any suitable electron beam images. Computer subsystem 402 may be configured to perform any of the functions described herein using the output of the detector 407 and/or the electron beam images. Computer subsystem 402 may be configured to perform any additional step(s) described herein. A system 400 that includes the output acquisition subsystem shown in FIG. 4 may be further configured as described herein.

It is noted that FIG. 4 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 4 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 402 includes a processor 408, an electronic data storage medium 409, and a machine learning module 410. The processor 408 may include a microprocessor, a microcontroller, or other devices. The machine learning module 410 is illustrated as separate from the processor 408, but may be run on or otherwise be part of the processor 408. The processor 408 and/or the electronic data storage unit 409 optionally may be in electronic communication with a wafer inspection tool or a wafer review tool (not illustrated) to receive additional information.

The computer subsystem 402 may be coupled to the components of the system 400 in any suitable manner (e.g., via one or more transmission media, which may include wired and/or wireless transmission media) such that the processor 408 can receive output. The processor 408 may be configured to perform a number of functions using the output.

The computer subsystem 402, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

The processor 408 and electronic data storage unit 409 may be disposed in or otherwise part of the system 400 or another device. In an example, the processor 408 and electronic data storage unit 409 may be part of a standalone control unit or in a centralized quality control unit. Multiple processors 408 or electronic data storage unit 409 may be used.

The processor 408 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 408 to implement various methods and functions may be stored in readable storage media, such as a memory in the electronic data storage unit 409 or other memory.

If the system 400 includes more than one computer subsystem 402, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 408 may be configured to perform a number of functions using the output of the system 400 or other output. For instance, the processor 408 may be configured to send instructions to perform metrology on the wafer 404. In another example, the processor 408 may be configured to send the output to an electronic data storage unit 409 or another storage medium. The processor 408 may be further configured as described herein.

The processor 408 or computer subsystem 402 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 408 may be configured according to any of the embodiments described herein. The processor 408 also may be configured to perform other functions or additional steps using the output of the system 400 or using images or data from other sources.

In another embodiment, the processor 408 may be communicatively coupled to any of the various components or sub-systems of system 400 in any manner known in the art. Moreover, the processor 408 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 408 and other subsystems of the system 400 or systems external to system 400.

In some embodiments, various steps, functions, and/or operations of system 400 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 408 (or computer subsystem 402) or, alternatively, multiple processor 408 (or multiple computer subsystems 402). Moreover, different sub-systems of the system 400 may include one or more computing or logic systems. Therefore, the above description should not be interpreted as a limitation on the present disclosure but merely an illustration.

In an embodiment, the processor 408 is configured to receive and apply a design clip to a metrology area image such that one or more process change variations are suppressed and one or more tool distortions are enhanced thereby obtaining a synthesized image. The processor 408 may be configured to perform or send instructions to perform metrology operations on the synthesized image.

The electronic data storage medium 409 may contain the synthesized design clip.

The design clip may be a synthesized design clip generated by the machine learning module 410. The machine learning module 410 can be configured to receive images and data from one or more process modulated wafers; learn the process change variations using the images and data; and generate the synthesized design clip using the process change variations.

An additional embodiment relates to a non-transitory computer-readable medium storing program instructions executable on a processor. In particular, a processor, such as the processor 408, can be coupled to a memory in an electronic data storage medium, such as the electronic data storage medium 409, with non-transitory computer-readable medium that includes executable program instructions. The computer-implemented method may include any step(s) of any method(s) described herein. For example, processor 408 may be programmed to perform some or all of the steps of FIG. 2 or FIG. 3. The memory in the electronic data storage medium 409 may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In an embodiment, one or more programs are included on a non-transitory computer-readable storage medium. The one or more programs are for executing steps on one or more computing devices. The steps can include applying a design clip to a metrology area image thereby obtaining a synthesized image and communicating instructions to perform metrology operations on the synthesized image. One or more process change variations are suppressed and one or more tool distortions are enhanced when the synthesized image is obtained. The metrology area image may be a scanning electron microscope image or an average of a plurality of scanning electron microscope images.

The design clip may be a synthesized design clip. In this instance, the steps include generating the synthesized design clip using the process change variations using a machine algorithm. The machine algorithm may be a deep learning algorithm.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method of compensating for scanning electron microscope beam distortion-induced metrology error comprising:

receiving, at a processor, a metrology area image of a wafer, wherein the metrology area image is a microscopy image of the wafer;

receiving, at the processor, a design clip from a storage medium, wherein the design clip includes one or more design polygons and corresponds to an area of the wafer in the metrology area image;

applying the design clip to the metrology area image using the processor with an image comparison and rendering process thereby obtaining a synthesized image, wherein one or more process change variations are suppressed and one or more tool distortions are enhanced; and performing metrology operations on the synthesized image.

2. The method of claim 1, wherein the design clip is a design for the wafer.

3. The method of claim 1, wherein the design clip is a synthesized design clip, and wherein the synthesized design clip is generated by a method comprising:

generating the synthesized design clip using the process change variations with a machine algorithm; and communicating the synthesized design clip to the storage medium.

4. The method of claim 3, wherein the synthesized design clip is generated by a method further comprising:

receiving images and data from one or more process modulated wafers at a machine learning module; and learning the process change variations at the machine learning module using the machine algorithm.

5. The method of claim 3, wherein the machine algorithm is a deep learning algorithm.

6. The method of claim 1, wherein the metrology area image is a scanning electron microscope image.

7. The method of claim 1, wherein the metrology area image is an average of a plurality of scanning electron microscope images.

8. The method of claim 1, wherein the storage medium is a persistent, non-transient storage medium.

9. The method of claim 1, further comprising obtaining the metrology area image of the wafer using a scanning electron microscope.

10. The method of claim 1, further comprising tuning system components of a wafer metrology tool to reduce distortion based on the metrology operations.

11. A system for compensating for distortion-induced metrology error comprising:

a wafer metrology tool configured to produce a metrology area image, wherein the metrology area image is a microscopy image of the wafer; and a processor in electronic communication with the wafer metrology tool, wherein the processor is configured to receive and apply a design clip to the metrology area image using an image comparison and rendering process such that one or more process change variations are suppressed and one or more tool distortions are enhanced thereby obtaining a synthesized image, wherein the design clip includes one or more design polygons and corresponds to an area of the wafer in the metrology area image.

12. The system of claim 11, wherein the wafer metrology tool is a scanning electron microscope.

13. The system of claim 11, further comprising an electronic data storage medium containing the design clip, wherein the electronic data storage medium is in electronic communication with the processor.

14. The system of claim 11, wherein the processor is further configured to perform metrology operations on the synthesized image.

15. The system of claim 11, wherein the design clip is a synthesized design clip, and wherein the system includes a machine learning module that is configured to:

receive images and data from one or more process modulated wafers;

learn the process change variations using the images and data; and generate the synthesized design clip using the process change variations.

16. A non-transitory computer-readable storage medium, comprising one or more programs for executing the following steps on one or more computing devices:

applying a design clip to a metrology area image using an image comparison and rendering process thereby obtaining a synthesized image, wherein one or more process change variations are suppressed and one or more tool distortions are enhanced, wherein the metrology area image is a microscopy image of the wafer, and wherein the design clip includes one or more design polygons and corresponds to an area of the wafer in the metrology area image; and sending instructions to perform metrology operations on the synthesized image.

17. The non-transitory computer-readable storage medium of claim 16, wherein the design clip is a synthesized design clip, and wherein the steps include generating the synthesized design clip using the process change variations with a machine algorithm.

18. The non-transitory computer-readable storage medium of claim 17, wherein the machine algorithm is a deep learning algorithm.

19. The non-transitory computer-readable storage medium of claim 16, wherein the metrology area image is a scanning electron microscope image.

20. The non-transitory computer-readable storage medium of claim 16, wherein the metrology area image is an average of a plurality of scanning electron microscope images.

* * * * *